United States Patent [19]

Rabinowitz

[11] 4,190,817

[45] Feb. 26, 1980

[54] PERSISTENT CURRENT SUPERCONDUCTING METHOD AND APPARATUS

[76] Inventor: Mario Rabinowitz, 715 Lakemead Way, Redwood City, Calif. 94062

[21] Appl. No.: 767,139

[22] Filed: Feb. 9, 1977

[51] Int. Cl.$^2$ ............................................. H01F 7/22
[52] U.S. Cl. ........................................ 335/216; 29/599
[58] Field of Search .................. 335/216, 298; 29/599

[56] References Cited

U.S. PATENT DOCUMENTS

| | | | |
|---|---|---|---|
| 3,158,794 | 11/1964 | Swartz | 335/216 |
| 3,174,083 | 3/1965 | Swartz | 335/216 |
| 3,233,155 | 2/1966 | Athertoxi | 335/216 |
| 3,265,939 | 8/1966 | Rinderer | 335/216 |
| 3,323,089 | 5/1967 | Swartz | 335/216 |

OTHER PUBLICATIONS

Multipole Magnetic Field Trapping by Superconductors, M. Rabinowitz, IEEE Transactions on Magnetics, vol. Mag. 11, No. 2, 3/75.

*Primary Examiner*—George Harris

[57] ABSTRACT

Apparatus and method utilizing superconductors in the persistent current state are provided for storing magnetic fields of any configuration in such a way that the field may be varied in a controlled and reproducible manner; for creating a complex and/or large volume field by either of two modular methods; and for producing the most miniaturized magnetic field. Means are provided for increasing the fidelity, the magnitude, and the stability of the stored magnetic field.

30 Claims, 17 Drawing Figures

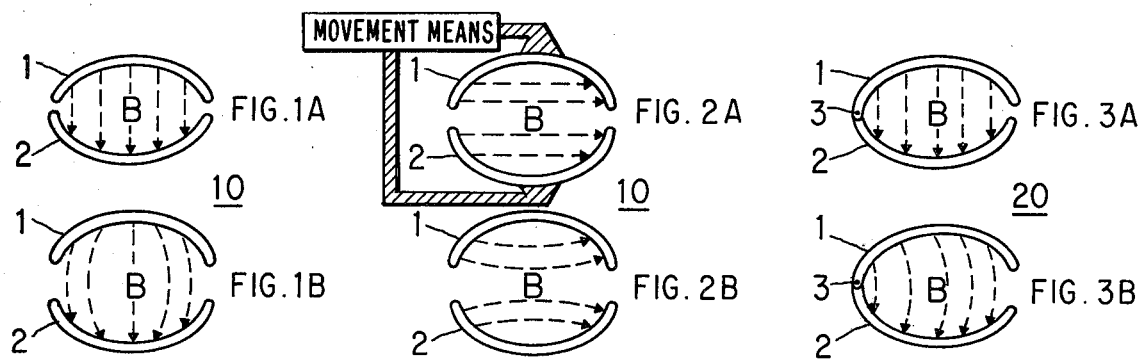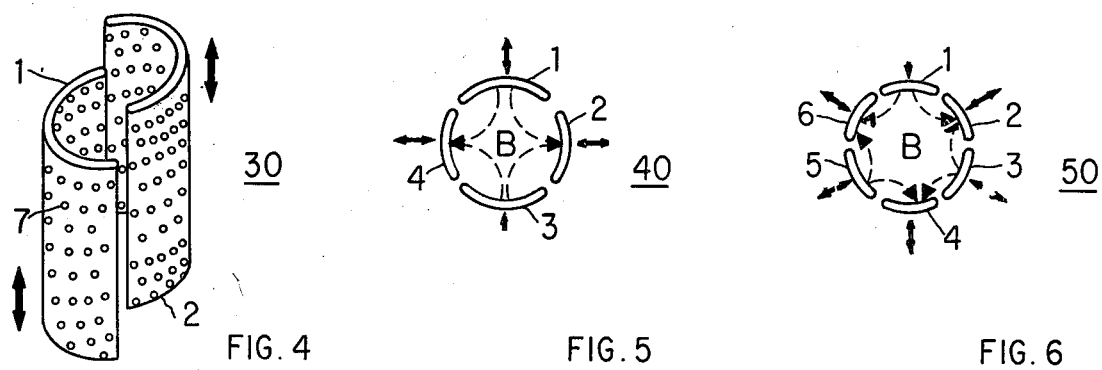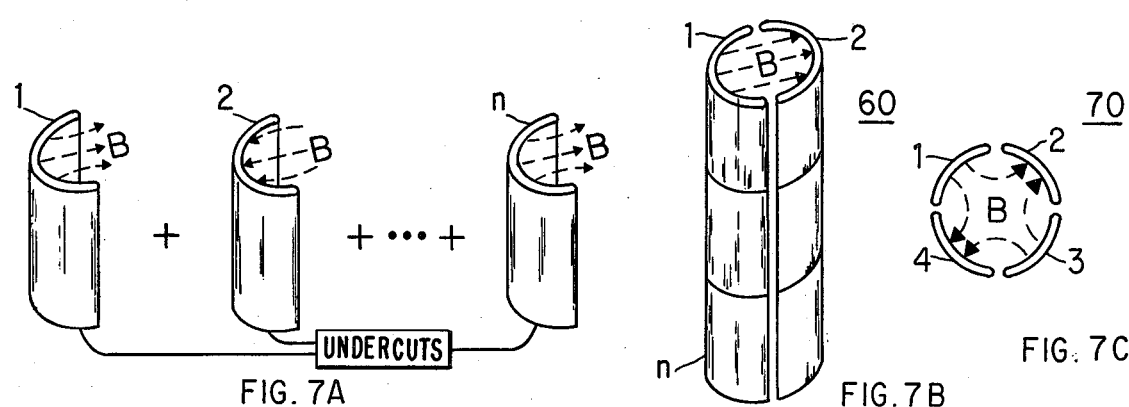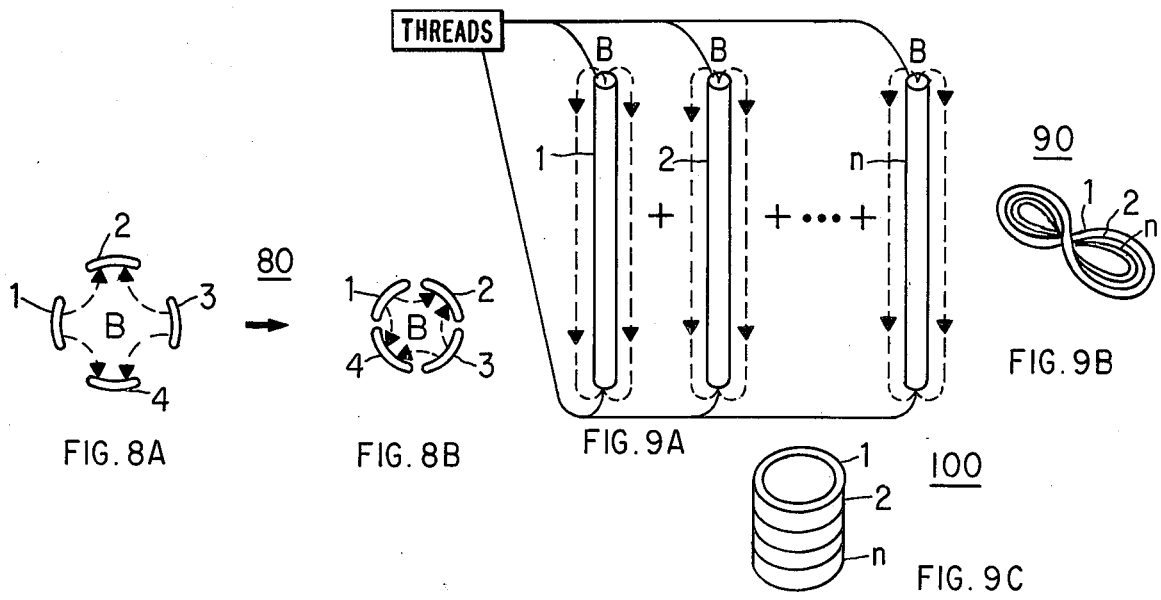

PERSISTENT CURRENT SUPERCONDUCTING METHOD AND APPARATUS

BACKGROUND OF THE INVENTION

1. Field of the Invention

This invention relates to methods and apparatus for storing magnetic fields of any configuration in such a way that the field may be varied in a controlled and reproducible manner utilizing superconductors in the persistent current state. This invention also provides for methods and apparatus for creating a complex magnetic field by means of flexible modular superconducting tubes, each containing a stored magnetic field. Furthermore this invention relates to the production of a large volume and/or complex magnetic field by combining small superconducting modules in each of which is stored a small part of the overall field. Finally the method and apparatus disclosed in this invention allow the production of the most miniaturized magnetic field. Means are provided for increasing the fidelity, the magnitude, and the stability of the stored magnetic field.

2. Description of the Prior Art

Since the discovery by Meissner and Ochsenfeld [Naturwiss. 21, 787(1933)] that a magnetic field is expelled from the bulk of a superconductor in the transition from the normal to the superconducting state, this effect (named the Meissner effect) has been considered a crucial property of superconductivity. However it has been found possible to circumvent the Meissner effect.

As shown by Rabinowitz, Garwin, and Frankel [Letters al Nuovo Cimento 7,1 (1973) and Applied Physics Letters 22, 599 (1973)], it is possible to trap and store in hollow or solid superconductors, any configuration magnetic field with high fidelity to the original pattern field. Rabinowitz [IEEE Trans. Magnetics, MAG-11, 548(1975)] has trapped a 17,600 Oersted uniform dipole magnetic field perpendicular to the axis of a $Nb_3Sn$ hollow cylinder. This is the highest value reported to date. Even higher values are possible. The stored fields may be highly stable.

SUMMARY OF THE INVENTION AND OBJECTS

In accordance with the present invention, the magnitude of the trapped magnetic field in a given direction or directions is made variable in a controlled and reproducible way by varying the relative positions of the superconducting walls within which the field is trapped, thus extending and improving its applicability.

In accordance with the present invention, a complex configuration magnetic field is produced by combining rigid modules each containing a relatively simple trapped field. In a further embodiment, a complicated magnetic field is created by combining flexible tubes each containing a relatively simple trapped field.

In accordance with the present invention, the most miniaturized magnetic field is produced by trapping a field in superconducting segments which are then compressed symmetrically together preserving the original larger magnetic configuration.

It is an object of the invention to provide apparatus, method, and means for varying a trapped magnetic field in a controlled and reproducible way.

It is another object of the invention to produce a complex magnetic field by combining simple components of this field.

It is an additional object to provide a method and means for producing the most miniaturized magnetic field.

Further object and features of the invention will be apparent from the following description in which the preferred embodiments are set forth in conjunction with the accompanying drawings.

BRIEF DESCRIPTION OF THE DRAWINGS

The following drawings illustrate specific embodiments of my invention.

FIGS. 1A and 1B depict end views of one embodiment for varying a trapped dipole magnetic field in accord with the invention. FIG. 1A shows the original trapped field. FIG. 1B shows the reduced field.

FIGS. 2A and 2B illustrates end views of a second embodiment of the invention for varying a trapped dipole magnetic field. FIG. 2A depicts the original trapped field. FIG. 2B depicts the decreased field.

FIGS. 3A and 3B are end views of a third embodiment of the invention for varying a trapped dipole magnetic field. FIG. 3A illustrates the original trapped field. FIG. 3B illustrates the decreased field.

FIG. 4 is a perspective view illustrating a fourth method for varying a trapped magnetic field with apparatus for increasing the stability and magnitude of the trapped field in another embodiment of the invention.

FIG. 5 depicts an end view of an embodiment for varying the magnitude of a trapped quadrupole magnetic field.

FIG. 6 illustrates an end view of an embodiment of the invention for varying the magnitude of a trapped sextupole magnetic field.

FIGS. 7A, 7B and 7C are perspective views illustrating method and apparatus for combining rigid modules to form a larger and/or more complex trapped magnetic field. FIG. 7A depicts separate wall segment modules. FIG. 7B illustrates the assembled modules forming a trapped uniform dipole field. FIG. 7C is a top view of the modules assembled to form a trapped quadrupole field.

FIGS. 8A and 8B are end views depicting method and apparatus for producing the most miniaturized magnetic field. FIG. 8A shows the original trapped quadrupole field. FIG. 8B illustrates the miniturization of this field.

FIGS. 9A, 9B and 9C are perspective views showing method and apparatus for creating a complex magnetic field by combining flexible tubes each containing a relatively simple trapped field. FIG. 9B demonstrates a complex field configuration formed by the tubes. FIG. 9C illustrates a less complex torroidal-like field formed with the tubes. FIG. 9A depicts the simple field in each tube.

DETAILED DESCRIPTION OF THE SPECIFIC EMBODIMENTS

The novel features which I believe to be characteristic of my present invention are set forth with particularity in the appended claims. My invention itself, however, both as to its organization, apparatus, and method of operation, together with further objects and advantages thereof, will be better understood by reference to the following description taken in connection with the accompanying drawings which represent particular embodiments of my invention.

Referring to FIG. 1, there are shown two separate superconducting wall segments 1 and 2 between which is trapped a dipole magnetic field B. FIG. 1A shows the original trapped dipole field with the two segments close together, and the field in a generally transverse direction to the walls, and parallel to the direction of separation. The letter B designates the magnetic field which is depicted by dotted lines with arrows indicating the direction of the field. The field may be increased by moving the the segments closer together, or decreased by moving them apart to a further separation as shown in FIG. 1B, for the assembly 10.

The superconducting wall segments 1 and 2 in FIG. 1 are held securely in position by a standard drive mechanism which decreases or increases their separation when it is desired to increase or decrease the field B relative to its original trapped value. This is similarly done for FIGS. 2, 3, 4, 5 and 6. In all these cases the amount of increasing or decreasing the separation and hence the incremental change in field must not exceed certain limits. The incremental change that may be obtained is a function of a number of parameters such as how close the trapped field is to the maximum trappable field, wall thickness, superconducting material, pinning force, etc. The closer the trapped field is to the maximum trappable field for the given material, the smaller the incremental field variation that may be obtained without losing trapped field. The converse is also true. The same applies for low pinning force in the superconductor.

Either of two procedures may be followed in trapping the magnetic field as related to any of the FIGS. 1 through 9, starting with a pattern field which is to be trapped (replicated) between the superconducting walls.

PROCEDURE I
1. External pattern field is on.
2. Cool superconductor below its transition temperature to $\sim 4°$ K. in the external field.
3. Turn off external field, and field remains trapped in the superconductor and in the space between the superconducting walls.

PROCEDURE II
1. Superconductor is below its transition temperature $\sim 4°$ K.
2. Turn on external field and drive the magnetic field into the superconductor by exceeding the critical shielding field.
3. Turn off external field and field remains stored.

The relevant cited references discuss the trapping procedures, indicate the maximum trappable field, and the fidelity to the pattern field that can be expected. They also explain how an initially simply connected superconductor becomes multiply-connected in trapping magnetic flux in the form of fluxoids. The role of various parameters such as the fluxoid pinning force are also discussed.

Referring now to FIG. 2A, there is shown a trapped dipole field B generally transverse to the direction of separation between two superconducting wall segments 1 and 2. The field is increased by decreasing the separation between the segments from that shown in FIG. 2A, and decreased by increasing the separation as in FIG. 2B, for the device 10.

As shown in FIG. 3, the superconducting wall segments 1 and 2 are joined together by a hinge 3, and contain a trapped magnetic field B between them which is in a generally transverse direction to the walls. In fact, the magnetic field B may be trapped in any orientation with respect to the walls in FIGS. 1, 2, and 3. In FIG. 3A, by closing the end opposite the hinge 3, the field B may be increased. The field B may be decreased as shown in FIG. 3B, by opening the end opposite hinge 3. The change in the field B for FIG. 3 is not symmetrical, as it is shown for FIGS. 1 and 2. In FIG. 3 the change in the field B is greatest opposite the hinge and least nearest the hinge, as segments 1 and 2 of device 20 are moved together or apart. This non-symmetry can also be achieved for the configurations of FIGS. 1 and 2, as well as those depicted in the other figures by a non-symmetrical displacement of the respective wall segments.

FIG. 4 shows in perspective an additional apparatus and method for varying the trapped magnetic field which may be used singly or in combination with the means described in conjunction with the embodiments of the other figures. In FIG. 4 the superconducting wall segments 1 and 2 may also be moved in an axial direction as shown by the two-headed arrows. The field may be trapped with the segments 1 and 2 opposite each other. Moving the segments 1 and 2 apart axially decreases the effective volume of the originally trapped field, and changes the magnitude and configuration of the field in the parts of the wall segments which are no longer opposite each other. Conversely the original field may be reconstructed and the effective volume of the field increased, by moving segments 1 and 2 back together again for the assembly 30.

Increased pinning of the trapped field is depicted by the small circles 7. This increases not only the maximum field which can be trapped, but also the stability of the trapped field and its fidelity to the original pattern field. Increased flux pinning may be achieved by simple or esoteric means. One simple means is to bead blast the surfaces of wall segments 1 and 2. Another simple means is to add impurities to the superconductor which act as pinning centers as do all inhomogeneities in the material such as phase boundaries, precipitates, or dislocation cell walls.

A more subtle way to increase the flux pinning is to form a triangular lattice of very small normal (non-superconducting) regions 7 as depicted by the circles in FIG. 4. The normal regions may be tiny holes which are formed in the superconductor during its manufacture, or it may be subsequently etched to produce the holes, or otherwise perforated. Photo-etching or plasma-etching may be used to make a regular array of fine holes. Sintering very fine superconducting material together to form the wall segments is another way to produce increased pinning. This also increases the area of contact with the liquid helium, which is desirable.

This normal regions 7 may be holes or any non-superconducting material—preferably ferromagnetic particles. These normal regions 7 are preferably in the form of a triangular lattice or periodic array as depicted in FIG. 4. Increased pinning forces at the edges of the normal regions 7 tend to more strongly trap the cores of the fluxoids in these regions. The optimum array of the regions 7 is an equilateral triangular lattice whose density matches the density of fluxoids i.e. the flux density. Fluxoids are maintained by persistent superconducting vortex currents, most likely containing one flux quantum each in Type II, and a variable number of flux quanta in Type I depending on superconductor thickness. A flux quantum contains $2.07 \times 10^{-7}$ Gauss-$cm^2 = 2.07 \times 10^{-15}$ weber. A fluxoid may range from tens to thousands of angstroms in diameter being approximately equal to the superconducting coherence length. Thus the normal regions 7 are preferably of the order of magnitude of the coherence length and less than 10 microns in diameter. An array of normal regions 7 as described, will tend to make the fluxoid lattice act as a rigid whole. This rigid lattice of fluxoids is much more difficult to displace, thus being much more stable and rendering higher fidelity to the original pattern field. Therefore, when possible, it is preferred to have each fluxoid centered in a normal region 7.

One method of depositing ferromagnetic particles into the desired array of normal regions 7 is to utilize the trapped field itself to guide them. The procedure would be to trap a field, then deposit ferromagnetic material so that even higher fields could subsequently be trapped. In the presence of a trapped field, ferromagnetic material could be evaporated onto the segment walls in the presence of low temperature, low pressure helium gas. This evaporation of colloidal ferromagnetic particles such as iron (Fe), dysprosium (Dy), gadolinium (Gd), Terbium (Tb), Holmium(Ho), and their alloys will preferentially migrate to the centers of the fluxoids where the field strength is greatest if their saturation flux density is not exceeded. If it is, they will still be attracted to the vicinity of the fluxoid where the field strength is not as great. Depending upon the critical field of the superconductor used, it is desirable to have a correspondingly high saturation value for the ferromagnetic particles. In either case, the particles will deposit in the region of the fluxoids. By properly adjusting the evaporation rate, and the helium pressure, particles or agglomerates ranging from 100 to 1000 Å may be deposited in the desired array. Their bonding to the superconductor may be enhanced by depositing a non-ferromagnetic layer over them which is preferably of high thermal conductivity and high heat capacity. The latter will be discussed subsequently in conjunction with FIG. 5. A fine dispersion of ferromagnetic particles, preferably permanently magnetized, may be introduced by other means such as simple physical dispersion onto the wall segments with trapped field. Vibration of the walls will help to concentrate the particles in the region of the fluxoids. They may then be bonded to the wall segments by a non-ferromagnetic overlayer.

Just as the ferromagnetic particles are attracted to the fluxoids, the fluxoids are attracted to and constrained from moving by the particles. Even if the saturation magnetization of these particles is exceeded, the pinning force will still be augmented. It is the saturation value at low temperatures ($\sim 4°$ K.) which is much higher than at high temperatures, which is relevant. An additional advantage of using ferromagnetic material in the normal pinning regions 7 is that if there is a perturbation trying to cause flux motion away from these ferromagnetic normal regions 7, or otherwise causing a decrease in the trapped field, this would result in a cooling of these regions (for a small perturbation) due to adiabatic demagnetization.

Dysprosium, Dy, like most of the heavy rare earth metals exhibits a complex temperature dependent magnetic structure. There is spontaneous ordering at $\sim 176°$ K. The simple ferromagnetic state of Dy onsets at the Curie Temperature, $t_c = 87°$ K. In the ferromagnetic state, Dy exhibits the highest saturation induction, $B_s = 3.8$T (1 Tesla = $10^4$ Gauss) at $0°$ K., of any element. The (0001) plane and [1120] direction are the easy plane and direction of magnetization, respectively in the ferromagnetic state.

The heavy rare-earth metals, Gd, Tb, Dy, Ho, and Er undergo magnetic ordering below $300°$ K. In the ferromagnetic state, these metals exhibit much larger saturation magnetization, $B_s$, than those of the fourth row (Periodic Table of the Elements) transition metals Fe, Co, and Ni, or of alloys based on these metals. For example, high field Fe (with $\sim 3\%$ Si) has a $B_s$ 1.7 to 1.8 T at $300°$ K. and 2.2 T at $0°$ K., and the alloy $Fe_{0.65}Co_{0.35}$ has a $B_s = 2.5$ T at $0°$ K. By comparison, $B_s$ values at $0°$ K. range from 2.8 T for Gd to 3.8 T for Dy. Gd has the highest Curie temperature, $t_c = 286° - 293°$ K. of the ferromagnetic rare-earth elements.

Magnetization and magnetic entropy have been measured at $4.2°$ K. for the compounds $Dy_2Ti_2O_7$, $Dy_2O_3$, and $Gd_3Al_5O_{12}$, in applied fields up to 7 T. The measurements at $4.2°$ K. indicate that $Dy_2Ti_2O_7$ can absorb 30–70 joules/kg, while $Gd_3Al_5O_{12}$ can absorb 200 joules/kg during demagnetization due to magnetic entropy change. Depending upon the operating temperature, many other alloys and compounds may also be used, such as GdN, $Gd(OH)_3$, $GdAg_{0.8}In_{0.2}$, Pr alloys, $Gd_2(SO_4)_3 \cdot 0.8H_2O$, $Dy_2Er_{0.8}Al_{0.2}$, $Gd_xDy_y$ with decreasing amounts of Dy for higher temperatures, $Gd(PO_3)_3$, $Er_2O_3$, $Dy_2O_3$, $DyPO_4$, as well as other similar mixed oxides and hydroxides.

Table I lists the properties, including the Curie temperature $t_c$, of some possible ferromagnetic materials which may be used for the normal pinning regions 7 of FIG. 4 to both increase the pinning force, and to prevent a temperature rise during flux flow or flux jumping. For some applications where rapid quenching of the trapped magnetic field is a possibility together with the storage of large quantities of magnetic energy, the materials mentioned in Table I with high Curie temperatures may be added to help reduce the magnitude and rate of temperature rise. These are also reduced by the presence of high thermal conductivity, high normal electrical conductivity, and high heat capacity materials. This will be discussed in more detail in the description of preferred normal layered materials in conjunction with FIG. 5.

TABLE I.
POSSIBLE FERROMAGNETIC MATERIALS FOR NORMAL PINNING REGIONS

| Material | $t_c$ (°K.) | $B_s$ at 0° K.(Tesla) | Saturation Moment/Rare Earth Atom (Bohr Magnetons at 4 °K.) |
|---|---|---|---|
| Fe | 1043 | 2.2 | — |
| Co | 1390 | 1.8 | — |
| Ni | 630 | 0.64 | — |
| $Fe_{0.65}Co_{0.35}$ | 1240 | 2.5 | — |
| Tb | 219 | 3.3 | |
| Dy | 87 | 3.8 | |
| Ho | 20 | 3.7 | |
| Er | 20 | 3.4 | |
| Gd | 286–293 | 2.8 | 7.5 |
| $Gd_5Si_4$ | 336 | | 7.2 |
| $Gd_3Al_2$ | 282 | | 7.1 |
| $Tb_5Si_4$ | 225 | | 6.5 |
| $Gd_3In$ | 213 | | 5.2 |
| $GdAl_{1.9}Ni_{.1}$ | 191 | | 7.2 |
| $GdAl_2$ | 182* | | 7.1 |
| $Tb_{.2}Gd_{.8}Al_2$ | 168* | | 7.4 |
| $Dy_3Si_4$ | 140 | | 7.1 |
| $TbAl_2$ | 121* | | 8.6 |
| $Tb_{.8}Dy_{.2}Al_2$ | 168* | | 7.4 |
| $Dy_3Si_4$ | 140 | | 7.1 |
| $TbAl_2$ | 121* | | 8.6 |
| $Tb_{.8}Dy_{.2}Al_2$ | 109 | | 8.5 |
| $Ho_5Si_4$ | 76 | | 7.4 |

TABLE I.-continued
POSSIBLE FERROMAGNETIC MATERIALS
FOR NORMAL PINNING REGIONS

| Material | $t_c$ (°K.) | $B_s$ at 0° K.(Tesla) | Saturation Moment/Rare Earth Atom (Bohr Magnetons at 4 °K.) |
|---|---|---|---|
| DyAl$_2$ | 70 | | 9.6 |
| HoAl$_2$ | 42* | | 9.2 |
| ErAl$_2$ | 24* | | 7.0 |

*$t_c$ at 1.9T.

FIG. 5 depicts an embodiment of the invention for varying the magnitude of a trapped quadrupole magnetic field. By moving the wall segments 1,2,3, and 4 outward in the radial direction as shown by the two-headed arrows, the trapped quadrupole magnetic field B is decreased. Conversely, by moving 1, 2, 3, and 4 inward radially, the field B is increased. The configuration of the trapped field B may be changed by moving the wall segments 1, 2, 3, and 4 non-symmetrically with respect to each other in the apparatus 40.

The choice of materials for the wall segments determines in large part the maximum trappable field as well as the fidelity of the trapped field to the original pattern field. Type II superconductors with high second critical field, $H_{c2}$, and high critical temperature $T_c$ are preferred. Thin layers of superconductor sandwiched between a high thermal conductivity and heat capacity normal metal are also preferred. The normal layers may be Cu or Al, and/or more esoteric materials which will be discussed subsequently. The layering of the superconductor gives it much higher pinning compared with the same total thickness of a monolithic piece, as much more surface pinning is thus provided. The addition of the normal layers greatly increases the heat capacity and thermal conductivity, and hence stability of the composite.

For example, it was possible to trap a 17.6 kOe uniform dipole field in a Cu layered cylinder with 40 Nb$_3$Sn double layers each of thickness ~18 μm giving 12 kOe/mm trapping ability. At lower field levels (1 kOe) much fewer layers are required so that the trapping ability may be as high as 50 kOe/mm. Similarly if the Nb$_3$Sn thickness is only thousands of Å, the trapping ability at low fields is as high as 200 kOe/mm.

Table II lists some possible superconducting materials and their critical temperatures, which may be used in the practice of this invention.

TABLE II.
POSSIBLE SUPERCONDUCTING MATERIALS
(x and y are variable percentages)

| Material | Critical Temperature, $T_c$, °K. |
|---|---|
| Nb | 9.5 |
| Pb | 7.2 |
| Ta | 4.4 |
| V | 5.1 |
| AlNb$_3$ | 18 |
| AsBiPd | 9.0 |
| AsBiPbSb | 9.0 |
| AuNb$_3$ | 11.5 |
| CMo | 9.3 |
| C$_{0.5}$Mo$_x$Nb$_y$ | ~11 |
| C$_{0.5}$Mo$_x$Ti$_y$ | 10.2 |
| CN$_x$Nb$_y$ | ~17 |
| CNb | 10.3 |
| CNb$_2$ | 9.2 |
| C$_{0.5}$Ta$_x$W$_y$ | ~10 |
| DNb$_{0.13}$ | 9.12 |
| Ga$_2$Mo | 9.5 |
| Ga$_4$Mo | 9.8 |
| GaNb$_3$ | 20 |
| GaV$_3$ | 15-16.8 |
| GeNb$_3$ | 23 |
| InLa$_3$ | 10.4 |
| Ir$_2$Nb$_3$ | 9.8 |
| Mo$_3$Re | 10.0 |
| MoRu | 9.5-10.5 |
| Nb$_3$Pt | 9.3 |
| Nb$_{0.18}$Re$_{0.82}$ | 9.7 |
| Nb$_3$Sn | 18.1 |
| NbSn | 17.9 |
| Nb$_{3x}$SnTa$_{(1-x)}$ | 6-18 |
| Nb$_x$Ti$_y$ | ~10 |
| Nb$_x$Zr$_y$ | ~11 |
| Rh$_{0.1}$Zr$_{0.9}$ | 9.0 |
| SiV$_3$ | 16.8-17.1 |
| Si$_{0.9}$V$_3$C$_{0.1}$ | 16.4 |
| Si$_{0.9}$V$_3$B$_{0.1}$ | 15.8 |
| Si$_{0.9}$V$_3$Al$_{0.1}$ | 14.1 |
| SiV$_{2.7}$Zr$_{0.3}$ | 13.2 |
| Si$_{0.9}$V$_3$Ge$_{0.1}$ | 14.1 |
| SiV$_{2.7}$Nb$_{0.3}$ | 12.8 |
| SiV$_{2.7}$Mo$_{0.3}$ | 11.7 |
| SiV$_{2.7}$Cr$_{0.3}$ | 11.3 |
| SiV$_{2.7}$Ti$_{0.3}$ | 10.9 |

The critical temperature varies with impurities. The second critical field, $H_{c2}$, varies with temperature, impurities, and other lattice defects. The maximum trappable field may be as high as $\frac{1}{3}H_{c2}$ for many materials.

TABLE III.
$T_c$ AND $H_{c2}$ VALUES FOR
SOME EXCEPTIONAL SUPERCONDUCTORS

| Superconductor | $T_c$ °K | $H_{c2}$(at 4.2 °K) kOe |
|---|---|---|
| Nb$_3$Al | 18.9 | 300 |
| Nb$_3$Ga | 20.3 | 330 |
| Nb$_3$Ge | 23 | 370 |
| Nb$_3$(Al,Ge) | 21 | 410 |
| Nb$_3$Sn | 18.1 | 220 |
| Nb$_x$Ti$_y$ | 9.5 | 120 |
| Nb$_x$Zr$_y$ | 11.5 | 70-80 |
| V$_3$Ga | 15-16.8 | 230 |
| PbMo$_{5.1}$S$_6$ | 14.6 | 500 |
| V$_2$(Hf,Zr) | 10 | 240 |
| (V,Nb)$_2$Hf | 10 | 260 |

The A-15, beta-tungsten structure, superconductors such as Nb$_3$Al, Nb$_3$Ga, Nb$_3$Ge, Nb$_3$(Al,Ge), and Nb$_3$Sn are brittle as are many other high $H_{c2}$ materials. Because of the high $H_{c2}$ and concomitantly high critical current density at high fields of these materials, they are quite desirable as materials for high field electromagnets that are needed for applications such as nuclear fusion and magnetohydrodynamics. However these materials are very difficult to wind in electromagnets due to their brittleness. In the practice of this invention, such brittle materials and superconducting materials of all types can easily be used as no coil is wound with them. They may be monolythic, sintered, colloidal, layered, collaged, tape, and/or wire etc. depending upon availability and convenience. No specific geometrical configuration is required of the superconductor other than a generally enveloping surface to trap and maintain any given magnetic field. This is in contrast with an electromagnet which must be wound in a precise configuration for a given magnetic field. Since there are no wires, there is no heat leak down wire or tape leads which an ordinary superconducting magnet would encounter. This is another advantage of the trapped field.

The pattern field, may be either a normal or superconducting magnet. Since it need be on only for a very short time while its field is trapped, it may be pulsed to much higher fields than it would be capable of in steady state operation.

The trapped field can be made higher than the original field as described in this invention, or by introducing a superconducting plunger to increase the flux density inside a closed trapped field cylinder. The disadvantage of this latter method is that it decreases the working length of the trapped field. Since in many applications it is the integral of the flux density with respect to the length of the field that is important, the plunger method is of no value as the increase in flux density is inversely proportional to the decrease in length. As taught in this invention, the working length (proportional to the length of the cylinder) may be preserved as the flux density in the desired direction is increased or decreased.

The subdivision of a wall segment into a composite of alternating thin superconducting layers sandwiched between high conductivity normal metal layers greatly adds to the stability of the trapped magnetic field. This enhances both the fidelity and the magnitude of the trapped field. Both high thermal and high electrical conductivity are required of the normal metal. Fortunately (as understood by the Weidemann-Franz law) the two properties are concommitant in normal metals such as Cu and Al. The speed of flux flow is limited by the effective electrical conductivity of the composite in the normal state, as is the rate of field decay during quench. The electrical conductivity of the superconductor in the normal state is quite low compared with Cu or Al, as is the superconductor's thermal conductivity in either the superconducting or normal state. High thermal conductivity is required to remove heat from the superconductor during flux flow, flux jumps, or field decay.

The addition to the normal of high heat capacity materials also adds to the trapped field stability. If they are added in a totally dispersed form, they would scatter the heat carriers, thus reducing their mean free path and hence the thermal conductivity. However, their addition in small amounts in segregated or particulate form decreases the thermal conductivity only a little, and greatly increases the heat capacity. For example, adding powders of $Gd_2O_3$ or $GdAlO_3$ from 2 to 7% to Cu, increases the heat capacity up to 100 times that of Cu at 4° K., while reducing the thermal or electrical conductivity by only a factor of 2 to 4. Similar results can be expected with Al.

Many Gd compounds exhibit magnetic spin specific heat anomalies giving increased heat capacity in the low temperature range, ~4° K. Many such materials can be made to suit particular requirements in regard to sharpness and location of ordering temperature, particle size, type of transition, etc. Thus $Gd_xAl_yO_3$ (x and y are variable percentages) is one possibility, whereas $GdAl_xZ_yO_3$ is another, where Z is Fe, Cr, Mn, etc. With the use of these materials, small perturbations tending to decrease the trapped field, would cool the composite due to adiabatic demagnetization of the Gd spins. The ferromagnetic materials discussed in connection with FIG. 4 such as those listed in Table I would have this effect, and would thus be preferred materials to enhance the adiabatic stability of the superconductor.

Since the ferromagnetic materials, as selectively represented in Table I, can increase both the adiabatic stability and the pinning strength, they may be added to either the normal conductor, the superconductor, or both. In the latter case, they may be present as fine filaments running through the composite of superconductor and normal layers as depicted by the normal regions 7 in FIG. 4.

Another set of pertinent materials which may be added to the composite are the high specific heat magnetic ceramics. These have enormous specific heats at low temperatures due to a combination of low Debye temperature, low-lying Einstein acoustic mode, and broad magnetic phase transition. Their specific heat is ~10 times greater than that of Pb, which has an exceptionally high low-temperature specific heat.

Referring now to FIG. 6, there is shown apparatus 50, an embodiment of this invention for varying the magnitude of a trapped sextupole magnetic field. By moving the wall segments 1,2,3,4,5, and 6 outward as shown by the two-headed arrows, the trapped sextupole magnetic field depicted as B by the dotted lines with arrows is decreased. Conversely, by moving the segments 1, 2, 3, 4, 5, and 6 inward radially, the field B is increased. The configuration of the trapped field may be altered by moving 1,2,3,4,5, and 6 non-symmetrically with respect to each other.

In general, N wall segments will be needed to vary an N-pole field symmetrically, to preserve that unique polarity of field as the magnitude of the field is varied. In all cases, including the specific embodiments depicted by the FIGURES of this invention, the magnitude of the trapped field decreases towards the ends of the wall segments. Thus the length of the wall segments needs to be longer than the required active field length.

FIG. 7 shows the method and apparatus 60 for the production of a large volume and/or complex magnetic field by combining small superconducting modules in each of which is stored a small part of the overall magnetic field. In FIG. 7A are shown wall segments 1, 2, . . . n which are to be added together, each with a trapped field, which is shown as a transverse dipole field B for the purpose of illustration. The trapped field may also have other configurations. Wall segment 1 has the field B in the direction away from the inside surface as shown by the arrows, whereas segment 2 to be placed opposite 1, has the field B in the direction toward the inside surface as shown. The wall segments are then placed together as depicted in FIG. 7B to form a uniform transverse dipole field. To compensate for field decrease at the touching edges, the segments may be made with tapered, undercut, or dovetailed edges so as to overlap sufficiently to produce axial homogeneity of the field. Another method of field compensation is to place other sets of trapped field wall segments in field alignment over the first set in a displaced manner so as to overlap the edges of the first set. The wall segments may be threadably coupled.

One may start with a uniform dipole pattern field of short extension, and trap the field in pairs of adjoining wall segments such as 1 and 2, or continuous short hollow cylinders. The length and hence volume of the field is then increased by putting together the segments or cylinders as shown in FIG. 7B. Alternatively, by starting with the proper pattern field, similar to but only a fractional part of the final desired field, the field may be trapped in each segment singly. The final field is then created when the segments are joined together.

Either method may be used to produce the apparatus 70 shown in top view in FIG. 7C with trapped quadrupole field B. The segments 1, 2, 3, and 4 may be together initially in the field trapping process, or be brought together after each has trapped a portion of the final field. The segments are then stacked as depicted in FIG. 7B.

In this way, it is possible to create any configuration and volume of trapped magnetic field, besides those depicted in FIGS. 7B and 7C. The pattern field need be only a small fraction of the final trapped field.

FIG. 8 depicts the apparatus 80, and method for producing the most miniaturized magnetic field, as well as any reduction in physical volume of the trapped field with respect to the original pattern field. Whereas a quadrupole field B is shown for purposes of illustration, any magnetic field may thus be miniaturized. In FIG. 8A are shown wall segments 1, 2, 3, and 4 between which is trapped the field B. As shown, these segments are spaced far apart. They have trapped the field of a given size magnet which may be the smallest physical size magnet possible. To make the physical volume even smaller, the wall segments 1, 2, 3, and 4 are moved together as shown in FIG. 8B. In general for the miniaturization of an N-pole magnetic field, N wall segments will be needed to maintain the unique polarity; and they should be brought together symmetrically.

The magnitude of the trapped field B will increase as the volume, within which the field is contained, is decreased. It is important that the maximum trappable field for the given material used for the wall segments not be exceeded during miniaturization of the field. This can be predetermined by experimental measurement.

Turning now to FIG. 9, there is shown alternate apparatus 90, and method for the production of a complex and/or large volume magnetic field by combining flexible tubes each containing a relatively simple trapped field. In FIG. 9A, the flexible tubes 1, 2, ..., n are shown, each containing a simple solenoidal field B generally parallel to the axes of the tubes, inside them. The tubes are made of any material which is flexible at low temperatures, coated on the outside with a thin layer or layers of superconductor as previously described. Corrugated metal tubes are quite suitable. The simple field is shown as solenoidal, only for purposes of illustration. It may also be transverse to the axes of the tubes, and of any configuration. The tubes may have any cross-sectional geometry.

After the relatively simple field B is trapped in each of the tubes 1, 2, ..., n as shown in FIG. 9A, the tubes may be bent around and placed together to form a rather complex field configuration as representationally depicted in FIG. 9B. FIG. 9C shows a less complex torroidal-like field which may be easily formed with the tubes. A wide variety of possible field configurations may thus be created which would be extremely difficult to produce by other means. The tubes may be bevelled, undercut, threadably coupled, etc.

I have shown and described specific embodiments and forms of my present invention. In light of this disclosure, many modifications and alternate constructions will be obvious to one of ordinary skill in the art which do not depart from the spirit and scope of this invention. I, therefore, intend by the appended claims to cover all such modifications, changes, and alternative constructions as fall within their true spirit and scope.

What is claimed is:

1. A magnetic device comprising: superconducting wall segments; a trapped non-solenoidal magnetic field; means mounting said wall segments at variable spaced apart locations and including structure permitting at least one of the wall segments to move along a preselected path as the spacing between said wall segments is changed to vary the said trapped magnetic field.

2. A magnetic device as set forth in claim 1, wherein said trapped magnetic field is a multipole field.

3. A magnetic device as set forth in claim 1, wherein said wall segment is mounted for rectilinear movement.

4. A magnetic device as set forth in claim 1, wherein said wall segment is rotatably mounted.

5. A magnetic device as set forth in claim 1, wherein at least one of the wall segments is perforated.

6. A magnetic device as set forth in claim 1, wherein at least one of the wall segments has an array of ferromagnetic particles attached.

7. A magnetic device as set forth in claim 1, wherein at least one of the superconducting wall segments has an array of non-superconducting regions.

8. A magnetic device as set forth in claim 5, wherein said wall segments are perforated by using sintered superconducting material that is porous.

9. A magnetic device comprising: superconducting wall segment modules; a trapped non-solenoidal magnetic field in each module; means mounting each module to bring them together to form a different magnetic field than originally contained in each module.

10. A magnetic device as set forth in claim 9, wherein the edges are undercut to permit overlap of the modules in mortise-like joints.

11. A magnetic device as set forth in claim 9, wherein said modules are threadably coupled together.

12. A magnetic device comprising: superconducting wall segments; a trapped non-solenoidal magnetic field; means mounting said wall segments at variable spaced apart locations and including structure permitting at least one of the wall segments to move along a preselected path as the spacing between said wall segments is decreased to reduce the physical volume of the trapped non-solenoidal magnetic field.

13. A magnetic device as set forth in claim 12, wherein said trapped magnetic field is a multipole field.

14. A magnetic device comprising: flexible superconducting tubes; a trapped magnetic field in each tube; means mounting said tubes to combine them to form a different magnetic field than initially contained in each tube.

15. A magnetic device as set forth in claim 14, wherein there is only one said flexible superconducting tube.

16. A magnetic device as set forth in claim 14, wherein said flexible tubes are made of corrugated metal.

17. A magnetic device as set forth in claim 14, wherein said tubes are threadably coupled.

18. A magnetic device comprising: superconducting walls; a trapped non-solenoidal magnetic field; and an array of ferromagnetic particles attached to at least one of the walls.

19. A magnetic device as set forth in claim 18, wherein the ferromagnetic materials contain Gadolium.

20. A magnetic device as set forth in claim 18, wherein the ferromagnetic materials contain Dysprosium.

21. A magnetic device as set forth in claim 18, wherein the ferromagnetic materials contain Holmium.

22. A magnetic device as set forth in claim 18, wherein the ferromagnetic materials contain Erbium.

23. A magnetic device as set forth in claim 18, wherein the ferromagnetic materials contain Terbium.

24. A magnetic device comprising: at least one superconducting wall; a trapped non-solenoidal magnetic field; and alternating layers of high thermal conductivity normal material containing ferromagnetic particles and superconductor comprising the superconducting wall.

25. A method of varying the non-solenoidal magnetic field that is trapped between superconducting wall segments comprising the steps of: coupling at least one of the said wall segments to a structure; moving said wall along a predetermined locus as the distance between said wall segments is changed.

26. A method as set forth in claim 25, wherein said moving step includes rectilinear movement of said wall.

27. A method as set forth in claim 25, wherein said moving step involves rotational movement of said wall.

28. A method as set forth in claim 25, wherein said moving step includes reciprocating a wall segment along a preselected path.

29. In a method for reducing the volume of a trapped non-solenoidal magnetic field, the steps of:
 (a) trapping a non-solenoidal magnetic field between spaced apart superconducting wall segments;
 (b) reducing the spacing between said wall segments.

30. The method of claim 29 in which the space occupied by said walls and said magnetic field is reduced to a minimum.

* * * * *